United States Patent
Tsironis

(10) Patent No.: US 9,866,203 B1
(45) Date of Patent: Jan. 9, 2018

(54) HIGH RELIABILITY POWER TUNERS

(71) Applicant: Christos Tsironis, Dollard-des-Ormeaux (CA)

(72) Inventor: Christos Tsironis, Kirkland (CA)

( * ) Notice: Subject to any disclaimer, the term of this patent is extended or adjusted under 35 U.S.C. 154(b) by 0 days.

(21) Appl. No.: 15/458,424

(22) Filed: Mar. 14, 2017

Related U.S. Application Data

(60) Provisional application No. 62/311,130, filed on Mar. 21, 2016.

(51) Int. Cl.
  H03H 7/40   (2006.01)
  H03J 7/16   (2006.01)
  H03J 9/00   (2006.01)

(52) U.S. Cl.
  CPC ............. H03J 7/16 (2013.01); H03H 7/40 (2013.01); H03J 9/00 (2013.01)

(58) Field of Classification Search
  CPC ... H03H 7/38; H03H 7/40; H01P 5/04; G01R 27/32
  USPC .................. 333/263, 17.3, 32, 33
  See application file for complete search history.

(56) References Cited

U.S. PATENT DOCUMENTS

| | | | |
|---|---|---|---|
| 6,674,293 B1 | 1/2004 | Tsironis | |
| 8,466,758 B1 * | 6/2013 | Tsironis | H01P 5/04 333/17.3 |
| 9,666,928 B1 * | 5/2017 | Tsironis | H01P 5/04 |

OTHER PUBLICATIONS

"Load Pull for Power Devices" [online], [retrieved on Mar. 14, 2017], <URL: https://www.microwaves101.com/encyclopedias/load-pull-for-power-devices>.
"Computer Controlled Microwave Tuner—CCMT", Product Note 41, Focus Microwaves, Jan. 1998.
"Standing wave ratio, VSWR", [online], [retrieved on Mar. 2, 2017], <URL: https://en.wikipedia.org/wiki/Standing_wave_ratio>.
Euler formula, "Buckling" [online], [retrieved on Mar. 11, 2016], <URL:https://en.wikipedia.org/wiki/Buckling>.

* cited by examiner

*Primary Examiner* — Stephen E Jones

(57) ABSTRACT

High reliability impedance tuners used in high power measurements suffer fast heating and consequently thermal expansion of the central conductor, which has a very small mass and is thermally isolated from the tuner housing. This leads to false measurements or catastrophic tuner failure (short) of either the DUT or the tuner. A method is introduced for allowing the center conductor to expand linearly without deforming and risking loss of accuracy first and catastrophic failure later. Practical tests have shown significant thermal behavior improvement.

10 Claims, 16 Drawing Sheets

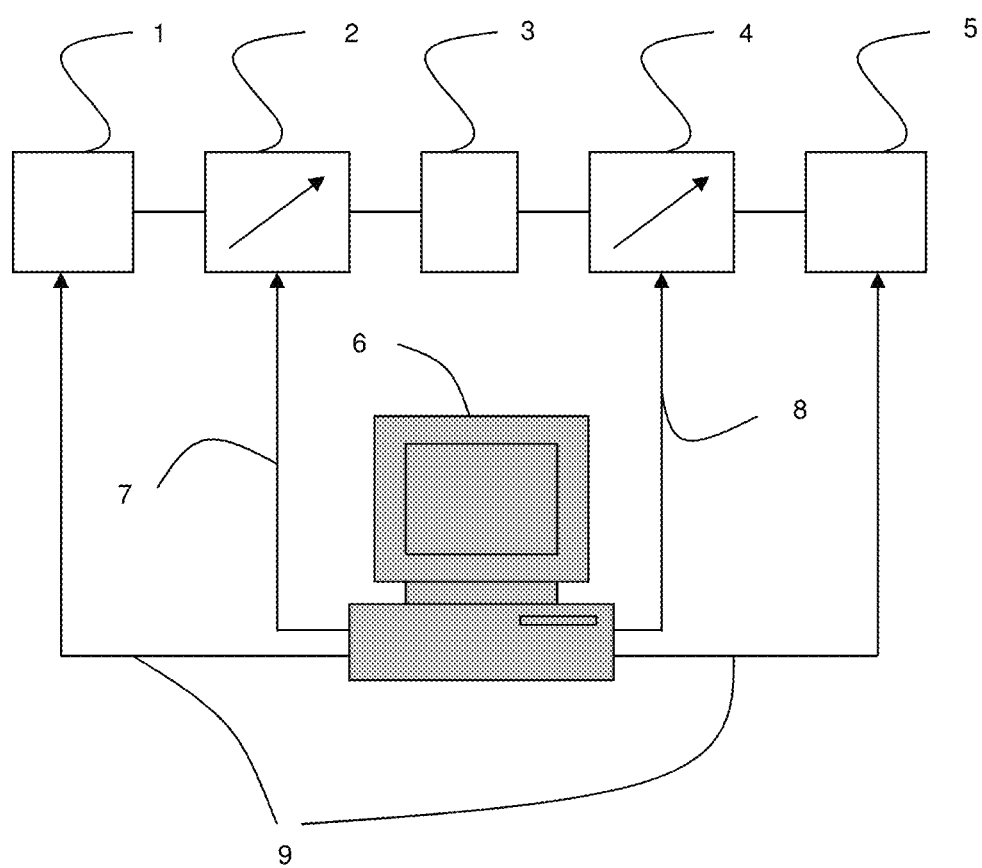
FIG. 1: Prior art

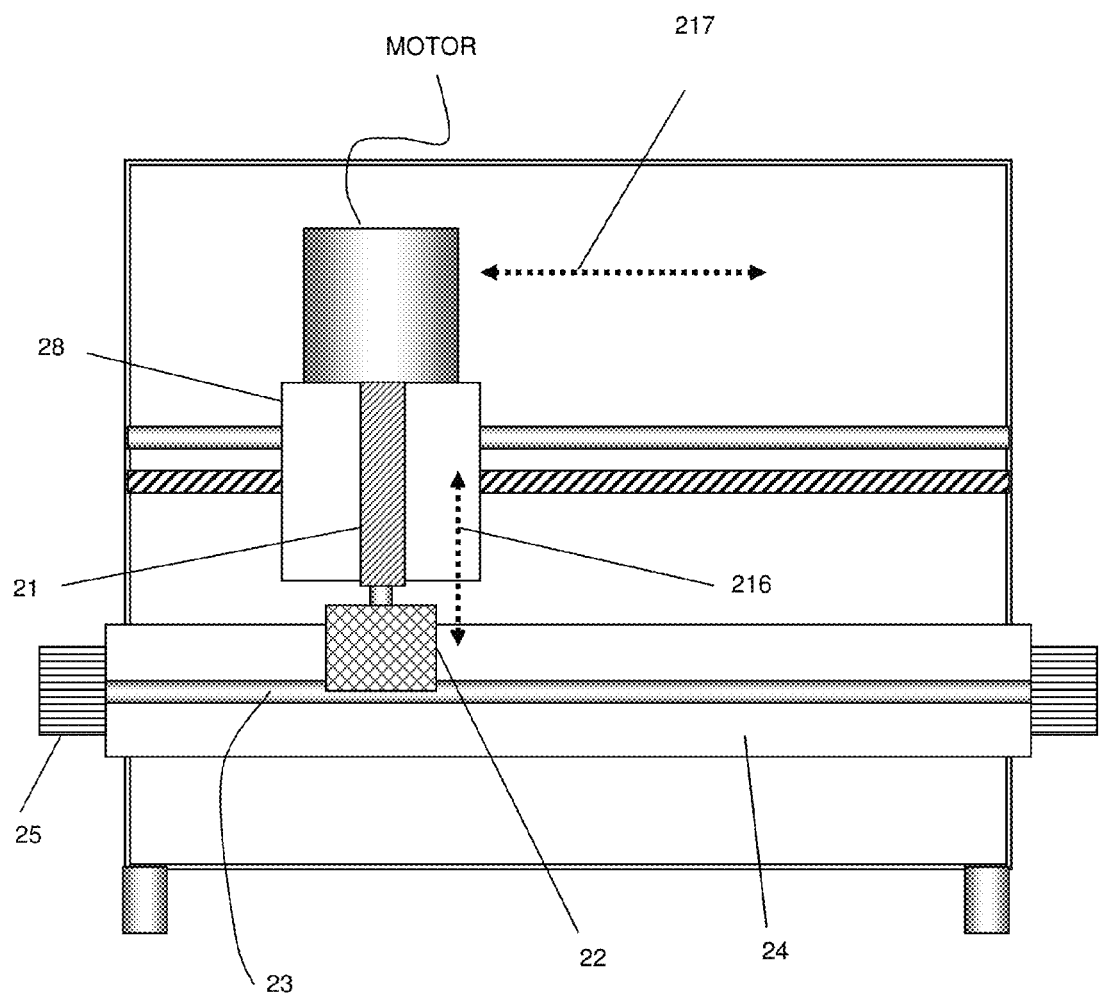
FIG. 2: Prior art

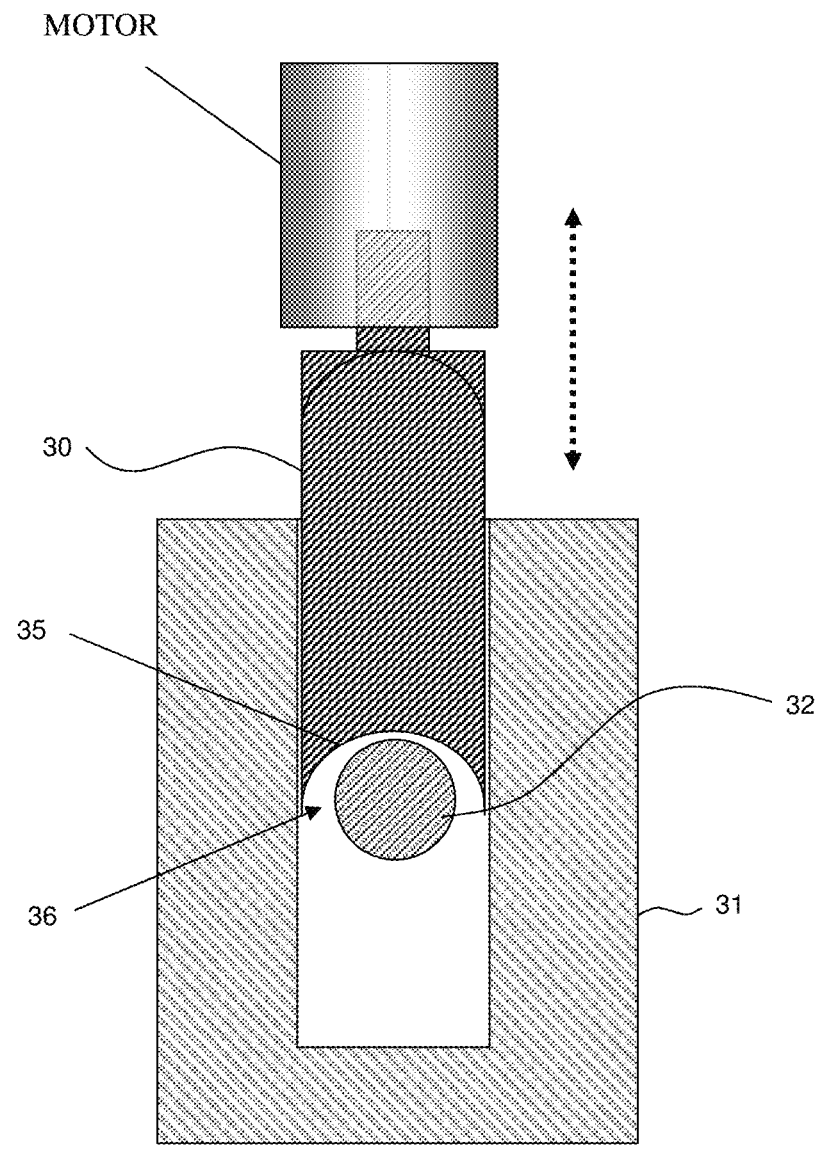
FIG. 3: Prior art

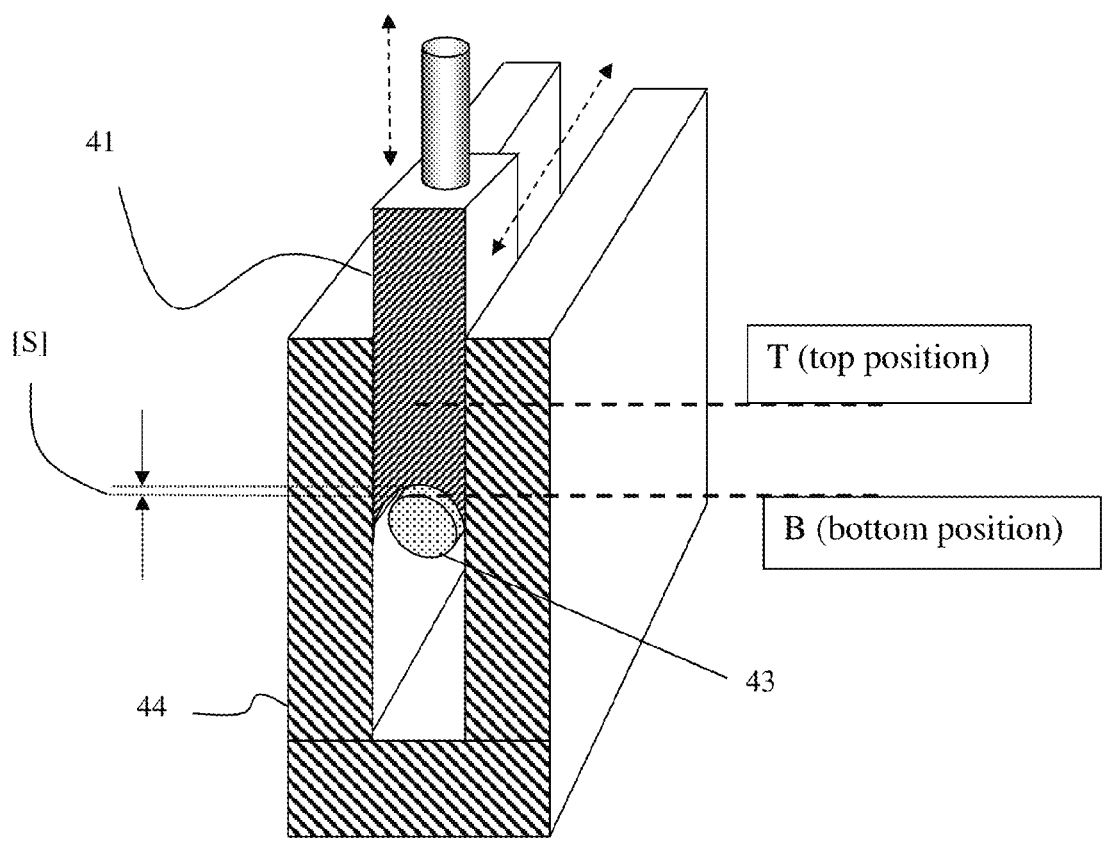
FIG. 4: Prior art

FIG.5A
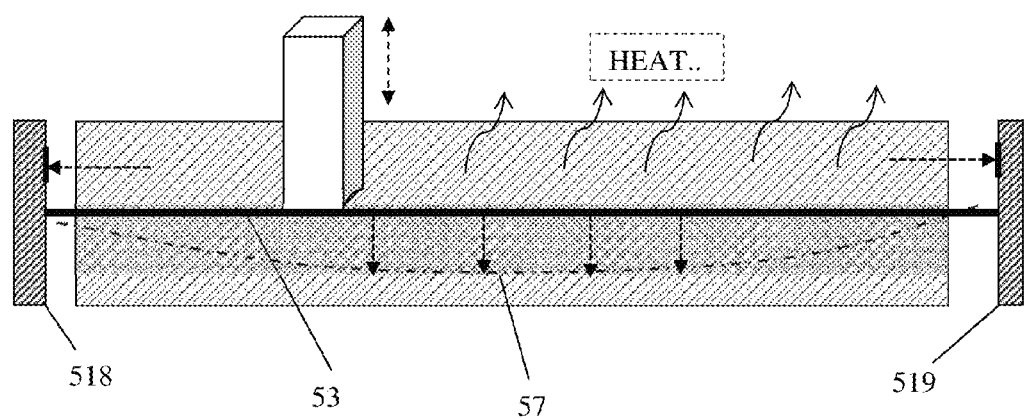
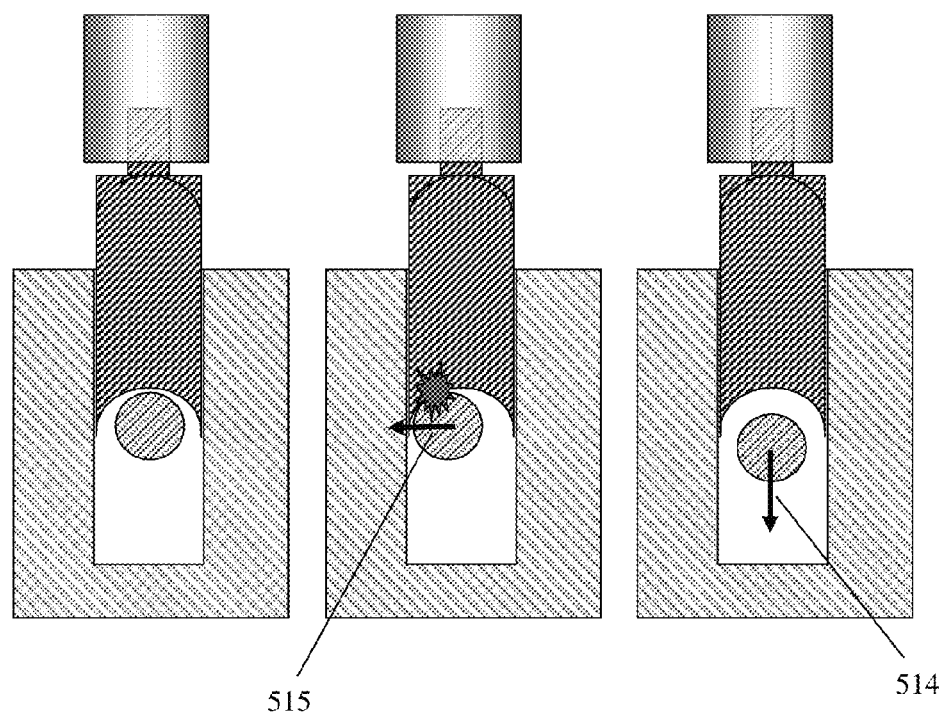
FIG. 5B1  FIG. 5B2  FIG. 5B3

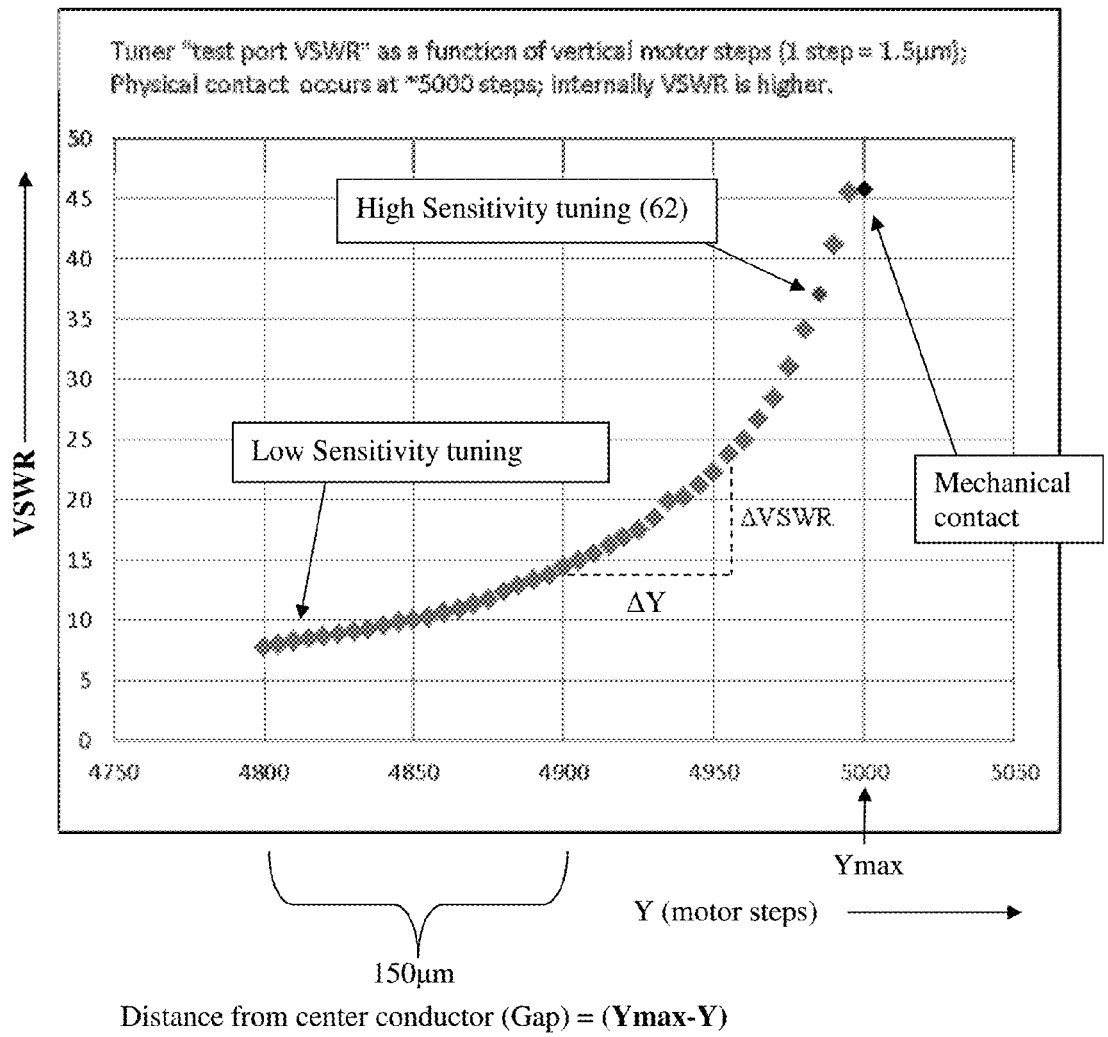
FIG.6: Prior art

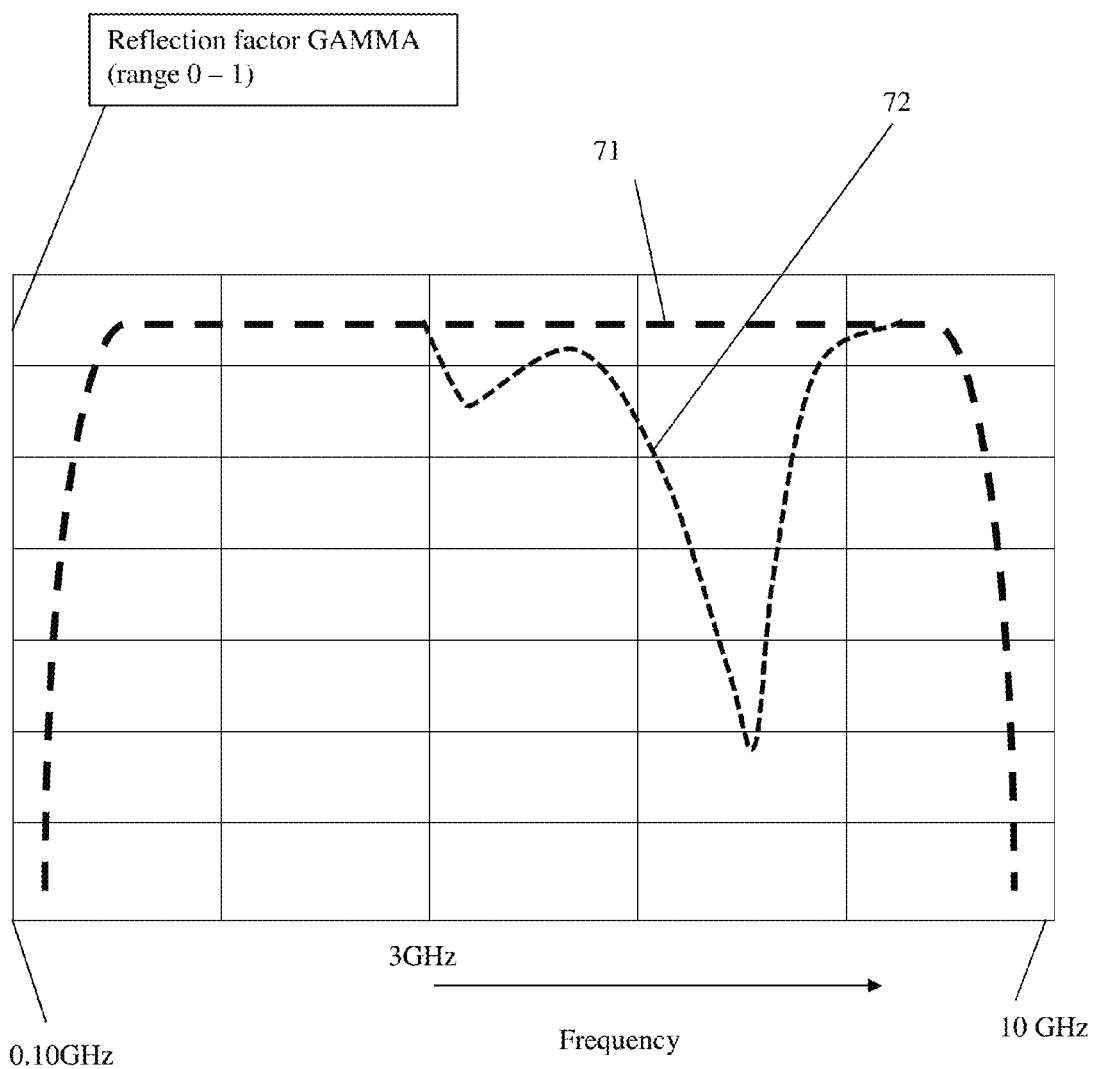
FIG.7: Prior art

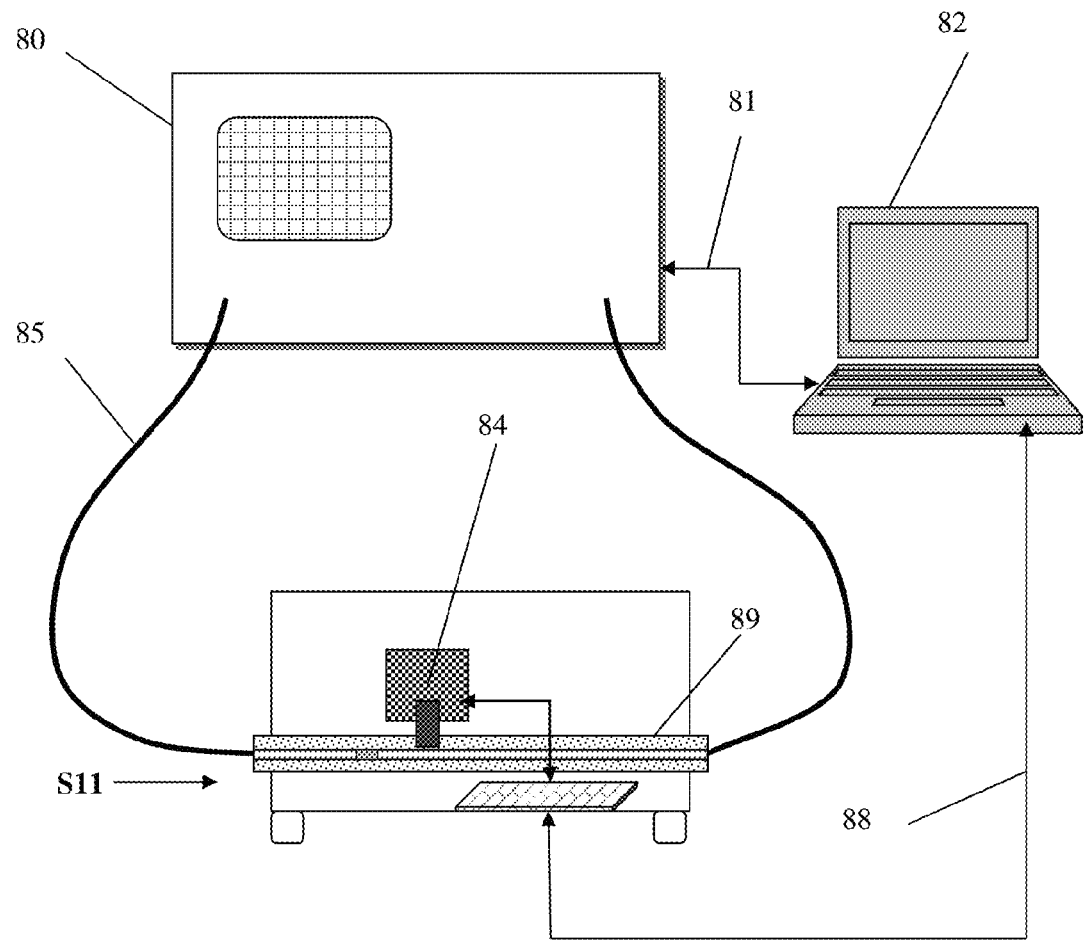
FIG.8: Prior art

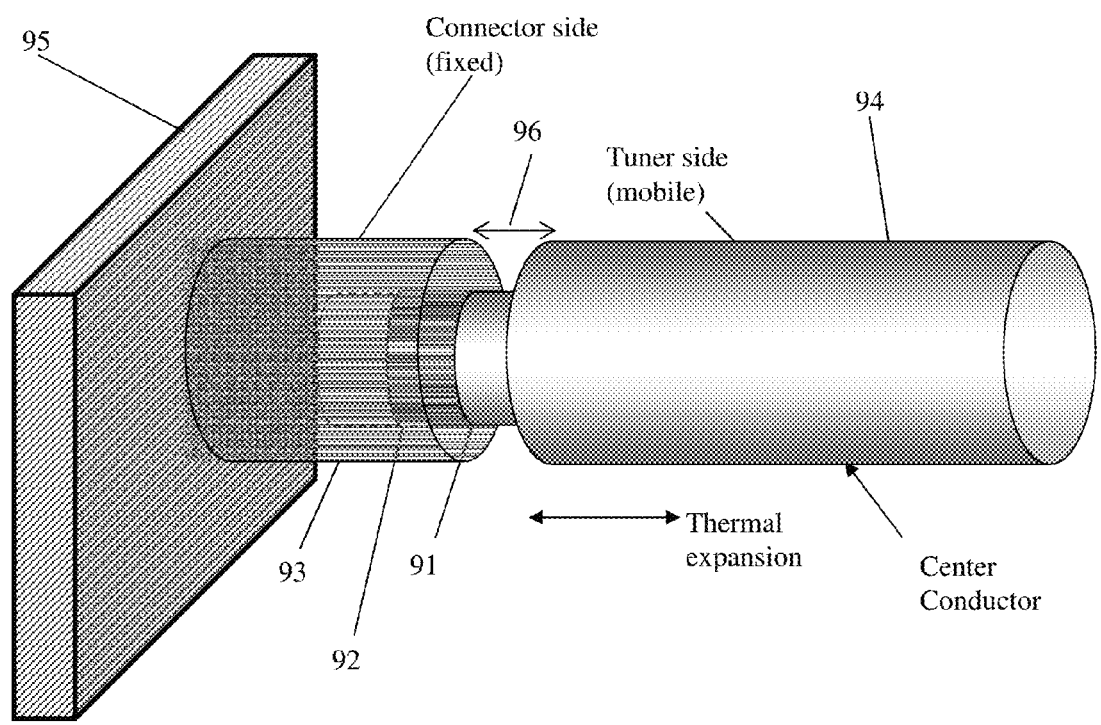
FIG. 9: Prior art

HIGH RELIABILITY POWER TUNERS

PRIORITY CLAIM

This application claims priority on provisional application 62/311,130 named "Temperature compensated High Power Tuners", filed on Mar. 21, 2016.

CROSS-REFERENCE TO RELATED ARTICLES

1. "Load Pull for Power Devices" [online], [retrieved on Mar. 14, 2017], <URL: https://www.microwaves101.com/encyclopedias/load-pull-for-power-devices>.
2. "Computer Controlled Microwave Tuner—CCMT", Product Note 41, Focus Microwaves, January 1998.
3. "Standing wave ratio, VSWR", [online], [retrieved on Mar. 2, 2017], <URL: https://en.wikipedia.org/wiki/Standing_wave_ratio>.
4. Tsironis, U.S. Pat. No. 6,674,293, "Adaptable pre-matched tuner system and method"
5. Euler formula, "Buckling" [online], [retrieved on Mar. 11, 2016], <URL:https://en.wikipedia.org/wiki/Buckling>.

BACKGROUND OF THE INVENTION AND PRIOR ART

This invention relates to remotely controlled electro-mechanical RF impedance tuners used in load and source pull testing of high power RF transistors and amplifiers.

Modern design of high power RF amplifiers used in various communication systems, requires accurate knowledge of the active device's (microwave transistor's) characteristics. In such circuits, it is insufficient for the transistors, which operate in their highly non-linear regime, close to power saturation, to be described using non-linear numeric models only.

A popular method for testing and characterizing such microwave components (transistors) in the non-linear region of operation is "load pull" (FIG. 1). Load pull is a measurement technique employing microwave impedance tuners 2, 4 and other microwave test equipment, such as signal sources 1, test fixtures and DUT 3 and power meters 5, the whole controlled by a computer 6; said computer controlling and communicating with said tuners 2, 3 and other equipment 1, 3 and 5 using digital cables 7, 8 and 9. The tuners are used in order to manipulate the microwave impedance conditions under which the Device Under Test (DUT, or transistor) is tested (see ref. 1); tuners allow determining the optimum impedance conditions for designing amplifiers and other microwave components for specific performance targets, such as gain, efficiency, inter-modulation etc.; this document refers hence to "tuners" as being "impedance tuners", in order to distinct from "tuned receivers (radios)", commonly referred to as "tuners" because of the included tuning circuits (see ref. 2).

Impedance tuners comprise, in general, a slotted transmission airline (slabline) 23, 24 and adjustable reflection probes 22, FIG. 2; the probe 22 is attached to a precision vertical axis 21 which is mounted inside a mobile carriage 28; the axis 21 can move the probe 22 vertically 216 towards the center conductor 23 and the carriage 28 can move the probe 22 horizontally 217 parallel to the center conductor 23 of the slabline 24. The vertical movement 216 changes the amplitude of the reflection factor seen at the tuner test port 25 whereas the horizontal movement 217 changes the phase. This way the whole impedance plan (Smith chart) is covered allowing a quasi-infinity number of impedances from Zmin to Zmax to be synthesized at any given frequency within the "tuning range" of the tuner. Typical values of state of the art tuners are |Zmin|≈2Ω and |Zmax|≈1250Ω; this corresponds to Voltage Standing Wave Ratio (VSWR) of 25:1 (FIG. 6). The relation between reflection factor and impedance is given by GAMMA=|GAMMA|*exp(jΦ), (Z−Zo)/(Z+Zo) {eq.1}, wherein Z is the complex impedance Z=R+jX and Zo is the characteristic impedance. A typical value used for Zo is Zo=50Ω (see ref. 3). The equivalent to GAMMA is the Voltage Standing Wave Ratio: VSWR=(1+|GAMMA|)/(1−|GAMMA|) {eq.2}.

Metallic probes 22, 30 or "slugs" are typically made in a cubical form 41 with a concave bottom 35 which allows to capture, when approaching the center conductor 32 (see FIG. 11 in ref. 4), the electric field, which is concentrated in the area 36 between the center conductor 32 and the ground planes of the slotted airline (slabline) 31, FIG. 3. This "field capturing" allows creating controllable high capacitance and reflection factors. The critical part is the required high proximity of the probe to the center conductor and the high accuracy of the vertical probe movement (FIG. 6), whereby changes in the vertical probe position 62 of a few micrometers affects the reflection factor (and the VSWR) by a large amount.

When the center conductor 53 of the slabline heats up, the solution disclosed here prevents it from bending 57 and eventually "buckling". This is obtainable if the center conductor is allowed to expand axially 105, 106, which it cannot do, if not modified, as shown in FIG. 5, because its expansion is limited by the connectors 518, 519. The prior art configuration of FIG. 9, whereby a protrusion 91 machined out of the main segment 94 of the center conductor slides into a hole 92 drilled into the fixed portion 93, does allow the center conductor to expand, but the required gap 96 must be at least twice as large as in the case of the present invention which is depicted in FIG. 10, whereby the gap is split in two, approximately equal, parts 104 and 109. Also, in the configuration of FIG. 9 the unmoving segment 93 of the center conductor is a short piece of center conductor, anchored permanently on the connector plate 95, and much shorter than the moving part 94 of the center conductor. This means not only that the thermal expansion of the free part 94 is larger (typically at least twice as long as in the case of FIG. 10, since its length is larger, thermal expansion of a rod is proportional to its length), but also that, because of its larger length, the slenderness factor "Length/Diameter" is larger. In the case of FIG. 10, if the joining tube 102 is placed in the middle of the center conductor, i.e. each free-standing segment is one half as long as the tuner (Length/2), then the slenderness factor will also be half, and, following Euler's formula (see ref. 5), the required force for the center conductor to bend or "buckle" will be four times larger. Therefore the risk of "buckling" under axial force will be four times smaller.

When microwave power is injected into the tuner, some of it is absorbed by the center conductor 53 of the slabline. This leads to a rise of its temperature and associated thermal expansion mostly along its axis. Since the center conductor 53 has only limited range for expansion, because it butts at the connectors 518 and 519, this leads to bending and eventually "buckling" 57 in FIG. 5A; "Buckling" of the center conductor happens in different ways, depending on its pre-forming, which cannot be "perfectly" straight, its "slenderness" factor Length/Diameter and the anchoring method at the connectors. Whereas in an ideal, low power and room temperature, situation FIG. 5B1, the center conductor is positioned exactly in the center of the slabline channel, when heated and it bends (deflects) it may either deflect sideways 515 or downwards 514 or both; of course, it may also deflect upwards (not shown), in which case we may have a premature electrical short circuit. In either case the effect is "at best" loss of accuracy or "at worst" an electrical short and damage of the tuner and/or the DUT.

In case a short happens with either temporary or permanent damage of the tuner or the DUT, at least the operator will be alerted and can take measures to correct the situation. But if it does not come to a short (case of FIG. 5B3), then the result will "only" be false measurement. This is because, as shown in FIG. 6, a relative movement between tuner probe and center conductor will change the calibrated VSWR; in other words, the data retrieved from the measurement instruments (FIG. 1) will be recorded at the wrong VSWR values. There will be no warning, just wrong data; it comes even worse: would the operator have doubts about the tuner accuracy, and would he disconnect the tuner from the test setup in order to re-calibrate or verify the calibration on a vector network analyzer (VNA), he, probably, will find that the tuner is accurate. This is because, during the dismantling of the setup the center conductor will cool down and recover its initial (calibrated) position (transition from states FIG. 5B2 or FIG. 5B3 back to original state FIG. 5B1); this can be a substantial systemic problem for high power testing using such tuners.

This invention discloses solutions allowing avoidance of such catastrophic and systemic test problems.

BRIEF DESCRIPTION OF THE SEVERAL VIEWS OF THE DRAWINGS

The invention and its mode of operation will be more clearly understood from the following detailed description when read with the appended drawings in which:

FIG. 1 depicts Prior Art: a typical automated transistor load pull test system.

FIG. 2 depicts Prior Art: a front view of an automated slide screw impedance tuner using a single vertical axis and RF probe (slug).

FIG. 3 depicts Prior Art: cross section of RF probe inside a slotted airline (slabline) approaching the center conductor.

FIG. 4 depicts Prior Art: a perspective view of relevant dimensions and parameters of the operation of a vertically adjustable RF probe (slug).

FIGS. 5A, 5B1, 5B2 and 5B3 depict prior art: FIG. 5A depicts the center conductor deformation due to heating and expansion and FIGS. 5B1 to 5B3 depict the possible deflection of the center conductor related to tuning probe: FIG. 5B1 corresponds to room temperature; FIG. 5B2 corresponds to sidewise deflection and short circuit and FIG. 5B3 to deflection away from the center conductor and false measurements.

FIG. 6 depicts prior art: the measured dependence of tuner VSWR from the proximity (distance) of the tuning probe to the center conductor.

FIG. 7 depicts the frequency response of a tuner probe positioned close to the center conductor in an ideal case 71 and in the case where the center conductor has moved 72 because of heating.

FIG. 8 depicts the test setup used to calibrate an automatic impedance tuner.

FIG. 9 depicts prior art: the method used to allow thermal expansion of center conductor in tuners (sliding contact).

DETAILED DESCRIPTION OF THE INVENTION

Figure 10:
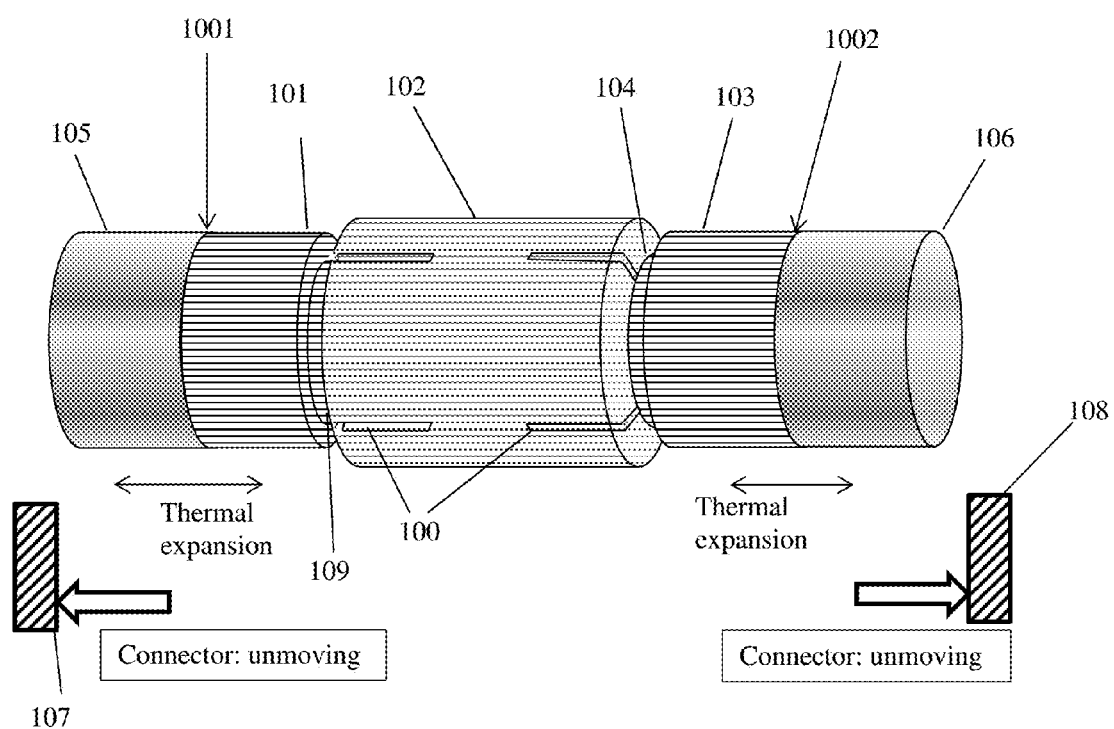
FIG. 10 depicts a segmented center conductor using an expansion ring, allowing the segments to expand linearly under influence of dissipated power and heat.

A prior art solution allowing for the thermal expansion of a metallic rod, used in mechanical engineering, involves a sliding contact (92 in FIG. 9); sliding contacts, in electrical engineering in general and microwave engineering can be unreliable and bear the risk of being worn out after a certain period of cycles, which in this case are heat/cool cycles. Also, in the area where one segment of the center conductor of a transmission line enters the other, the required jump in diameter 91 causes a spurious impedance jump. In this particular case the spurious impedance jump is inductive, since the exposed portion of the sliding contact 91 represents a series inductance and creates a higher characteristic impedance (Z1) than the slabline itself (Zo); it is therefore important (a) to reduce this gap 91 and associated impedance jumps as much as possible, especially at high frequencies, where the length of the gap 96 may be critical, relative to the signal wavelength; and (b) to introduce a compensation by creating a parallel capacitive load. This second point is possible by making the diameter of the tube 93 larger than the diameter of the center conductor 94. This has not been disclosed in the prior art (FIG. 9).

In order to account both (c) for the thermal expansion of the center conductor segments 105 plus 101 and 106 plus 103 and (d) for the characteristic impedance discontinuity, caused by the gaps 109, the diameter of the tube 102 is made larger than the diameter of the center conductor 105; an appropriate method for compensation the characteristic impedance discontinuity is to select the diameters of the adjacent center conductor segments, such as to cause the same decrease in Zo by the tube 114 as the increase to Zo created by the protrusions 1105 and 1106; as an example, if the diameter of the center conductor is 3 mm and the slabline channel 5,425 mm is wide, a Zo=Z(Do)=50Ω is created. A protrusion of a diameter of 2.5 mm creates a characteristic impedance of Z1=Z(D1)=60.9Ω; if the tube has a wall thickness of 0.5 mm, corresponding to an outside diameter of 3.5 mm, this creates a characteristic impedance of Z2=Z(D2)=40.8Ω; all together, both the arithmetic and geometric averages of those characteristic impedances amount to either 50.85Ω or 49.85Ω correspondingly, i.e. close to compensation. As a general rule one should aim to Z(D1)−Z(Do)≈Z (Do)−Z(D2), whereby Do is the diameter of the center conductor, D1 is the diameter of the protrusion and D2 is the diameter of the sliding tube.

Figure 12:
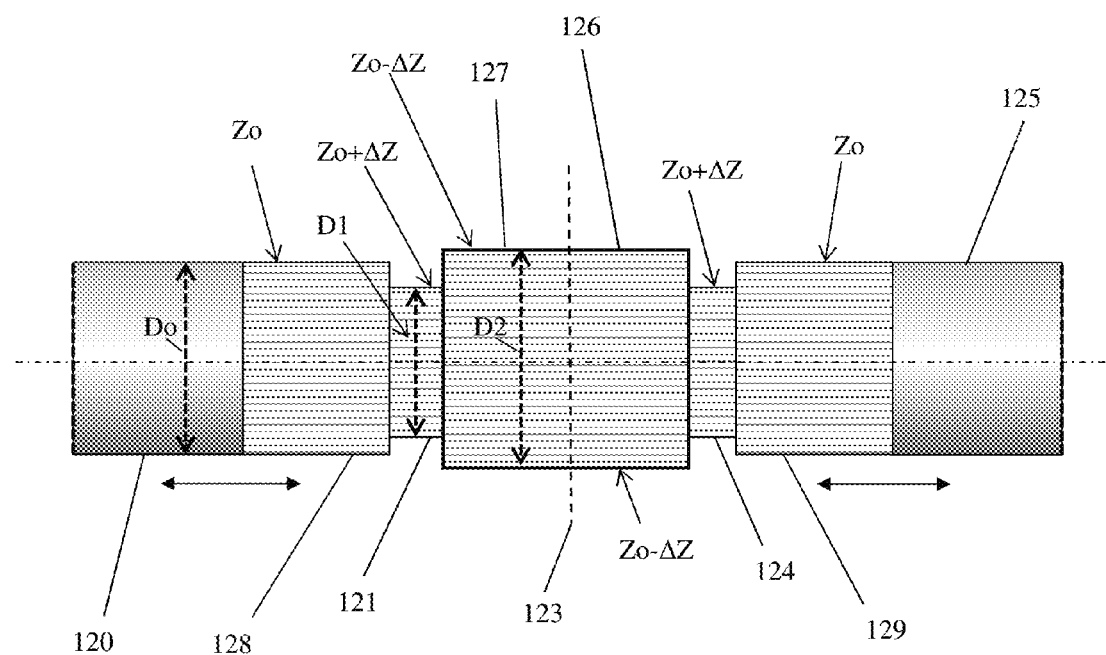
FIG. 12 depicts actual tube and rod diameters used to estimate inductive versus capacitive disturbance of the characteristic impedance of the segmented and temperature compensated center conductor.

Details of this configuration are shown in FIG. 12: the center conductor (typically a gold-plated steel rod) 120, 125 is cut short and two interface rods 128 and 129 are attached to center conductor ends tightly (typically using screw inserts) (see also items 1001 and 1002 in FIG. 10). The inserts 128 and 129 have the same diameter as the center conductor and thus create the same characteristic impedance Zo: Z(Do)=Zo (typically 50Ω). In order to allow the tube 126 to slide over the inserts and make RF contact the ends of the inserts 121, 124 must be reduced by carving out protrusions that will enter into the cavity 116 of the tube 114. The characteristic impedance of the protrusions is higher than Zo; we assume the difference to be ΔZ (in Ω), Z1=Z (D1)=Zo+ΔZ; To compensate for this disturbance the diameter D2 of the tube 126, 127 is made larger than Do leading to Z2=Z(D2)=Zo−ΔZ. In terms of symmetry the inductive behavior of protrusion 121 is compensated by the capacitive behavior of the left half of the tube 127 and the inductive behavior of protrusion 124 is compensated by the capacitive behavior of the right tube half 126. The symmetry plan 123 is arbitrary and can as well be the geometrical center of the tube. In any case this compensation holds only for a limited temperature range, because, as the center conductor heats and expands the exposed length of the protrusions shrinks and so does their inductive effect, whereby the capacitive effect of the higher diameter of the tube (D2>Do) does not really change. This compensation is though, better than no compensation at all.

A further problem of the prior art structure (FIG. 9) is reliability; if the thermal cycle is repeated several times, the silver or gold surface plating of the protrusion and/or the inner wall of the tube are going to wear out and the electrical conductivity is going to change (increase sharply). This depends on the thickness of the plating layer and the tightness of the sliding contact; of course if the whole body of the center conductor would be made of massive silver, brass or copper, excluding massive gold for cost reasons, the wearing out problem would disappear. However, high electrical conductivity is associated with lower mechanical sturdiness, i.e. such long center conductors would be prone to "sag" over time under its own weight. The material of choice for long center conductors is steel, which, because of its inherent high electrical resistance, has to be gold or silver plated. In this case the reliability problem of surface wear-out re-surfaces. The solution introduced here is to insert two interface rod segments on each side of the sliding tube, on which' protrusions the tube slides, made of homogenous massive high electrical conductivity material, such as brass, bronze, silver or copper, whereby there is no surface plating to be worn-out. This is shown in FIGS. 10 and 11.

The center conductor 105 and 106 is cut short by the sum of the lengths of the inserts 101 and 103, the tube 102 and the exposed sections of the protrusions 109 and 104. The tube 102 has several slots 100 cut parallel to its axis allowing a pre-bend inward to establish secure sliding contact on the protrusions on both sides. RF contacts are extremely critical; they must always be well defined and mechanically repeatable. This is ensured here using the pre-bending of the ends of the tube 102, which allows the RF contact to take place at the inside surface of the pre-loaded edge of the tube cylinder (see self-explanatory FIG. 13): The protrusion enters the cavity of the tube; the tube has axial slots 100, shown in FIG. 10; these slots allow to pre-bend the edge of the tube so it creates sliding RF contact with the protrusion body. This type of contact is reliable because of the pre-loading force and defines well the contact plan, at the edge of the tube. Since both, the tube and the protrusion are made of homogenous material, and are not surface-plated, rubbing of the tube edges on the protrusion body will, in fact, remove any residuals and keep the RF contact polished and highly conductive over time. On the side of the center conductor, the inserts 101 and 102 must make perfect surface contact with the center conductor segments at plans 1001 and 1002 to avoid spurious reflections. This is best ensured when both parts are tightened using centered screws 1102. The inserts and the center conductor expand and contract, under heating cycles, as a single unit. The expansion must be absorbed internally, since the limiting RF connectors 107 and 108 are considered non-yielding obstacles.

The thermal expansion of the center conductor can be calculated using the known formula $\Delta L = L * \alpha * \Delta \Theta$, whereby L is the length of the center conductor, ΔL the expansion, α is the linear thermal expansion coefficient of the center conductor material (in this case steel α≈45 ppm/° C.) and ΔΘ is the temperature increase in degrees. For instance, a typical steel center conductor of L=1000 mm would expand by approximately 1.2 mm if heated from 20° C. to 100° C., values which are typical for high power tuner operation. The larger gap required, in the prior art configuration, when the sliding contact is placed close to the connector (FIG. 9) is causing a larger parasitic inductance and inferior RF performance. When the sliding contact (connecting tube 102) is placed in the middle of the center conductor, meaning that the gap allowed is half as wide, each parasitic inductance, due to the protrusion 104, is half as large. The connecting tube 102 shall be manufactured from well conducting and elastic material, preferably spring-Bronze or Beryllium Copper (BeCu), because of its good electrical conductivity and strong spring-metal behavior, which allow long lasting and reliable DC and RF sliding contact between the tube's 102 inner walls and the protrusions 104, which move into and out of the tube; the protrusions 104, 109 are concentric with and machined (carved out) from the body of the interface rods 101, 103. The gaps are dimensioned to allow for maximum thermal expansion 105, 106, caused by the DC and RF power, the tuner is expected to handle. Slots 100 cut into the mantle of the connecting tube 102 provide for and enhance the spring mechanism for the sliding contact. As shown in FIG. 10, each segment 101, 103 will expand 105, 106 only towards the connecting tube 102, since the connectors 107 and 108 are unmovable obstacles (borders).

Figure 11:
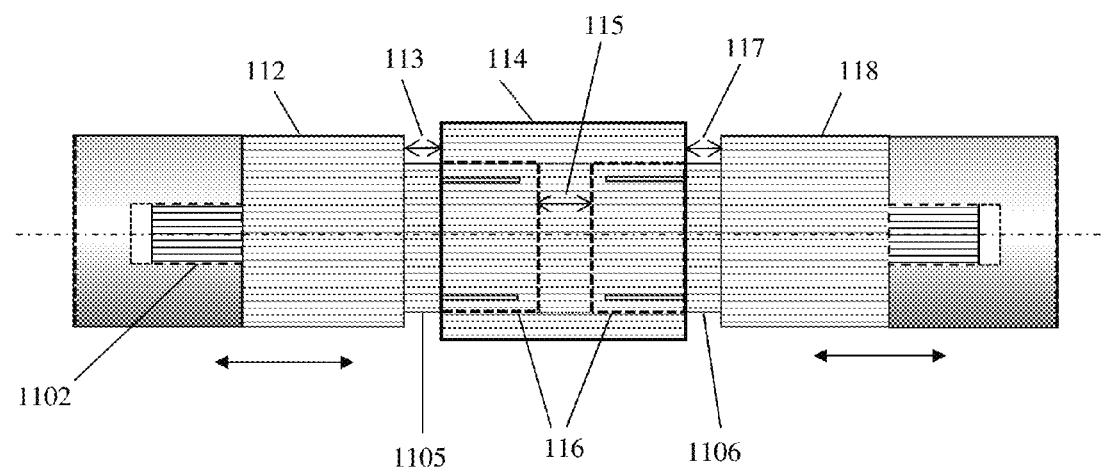
FIG. 11 depicts a front view of two segments of thermally expanding center conductor, joined by a conductive ring and associated dimensions.

The exact dimensioning of the connecting tube, the gaps and the protrusions is shown in FIG. 11: Each segment can expand a certain amount 113 and 117 before hitting the connecting tube walls 114. The gap 115, left between the tips of the protrusions 116, shall be larger than the sum of the two gaps 113 and 117 between the cores 118, 112 of the center conductor and the edges of the tube 114.

Figure 13:
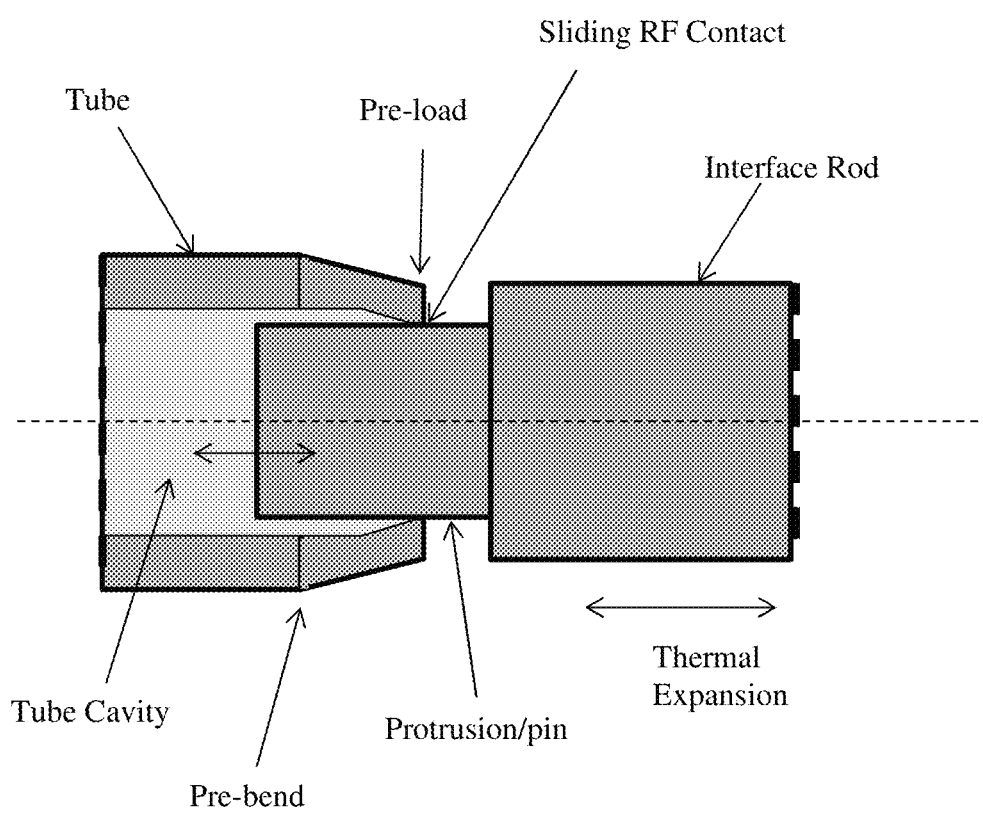
FIG. 13 depicts detail of reliable RF contact between the expansion tube and interface rod protrusion.
Figure 14:
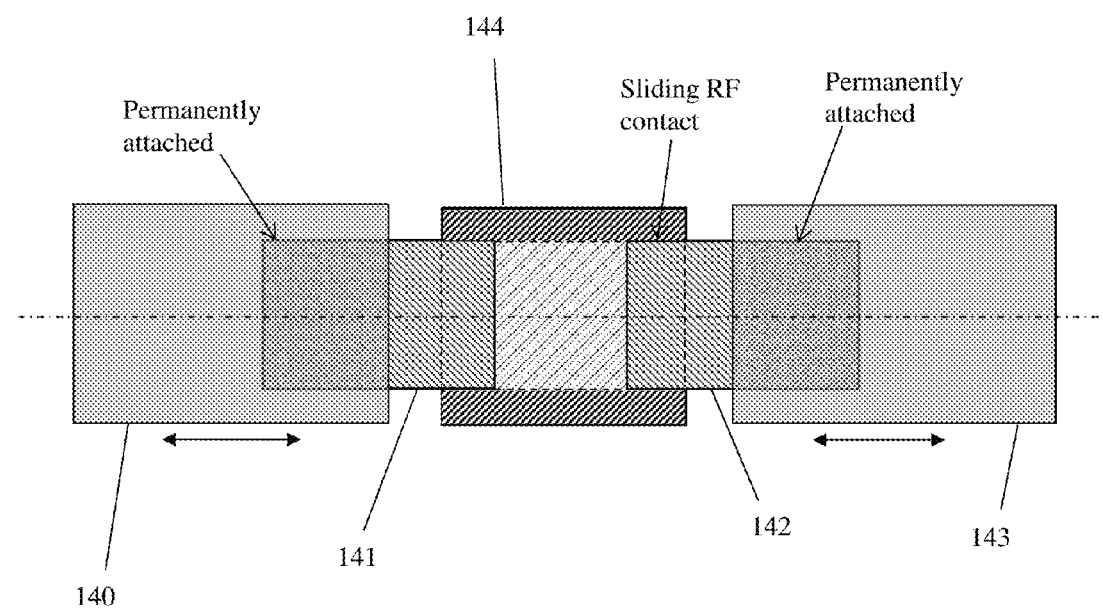
FIG. 14 depicts the contact tube sliding over massive protrusions inserted and attached permanently into the adjacent center conductor segments; the tube may have the same or different diameter as the center conductor, depending on the application.
Figure 15:
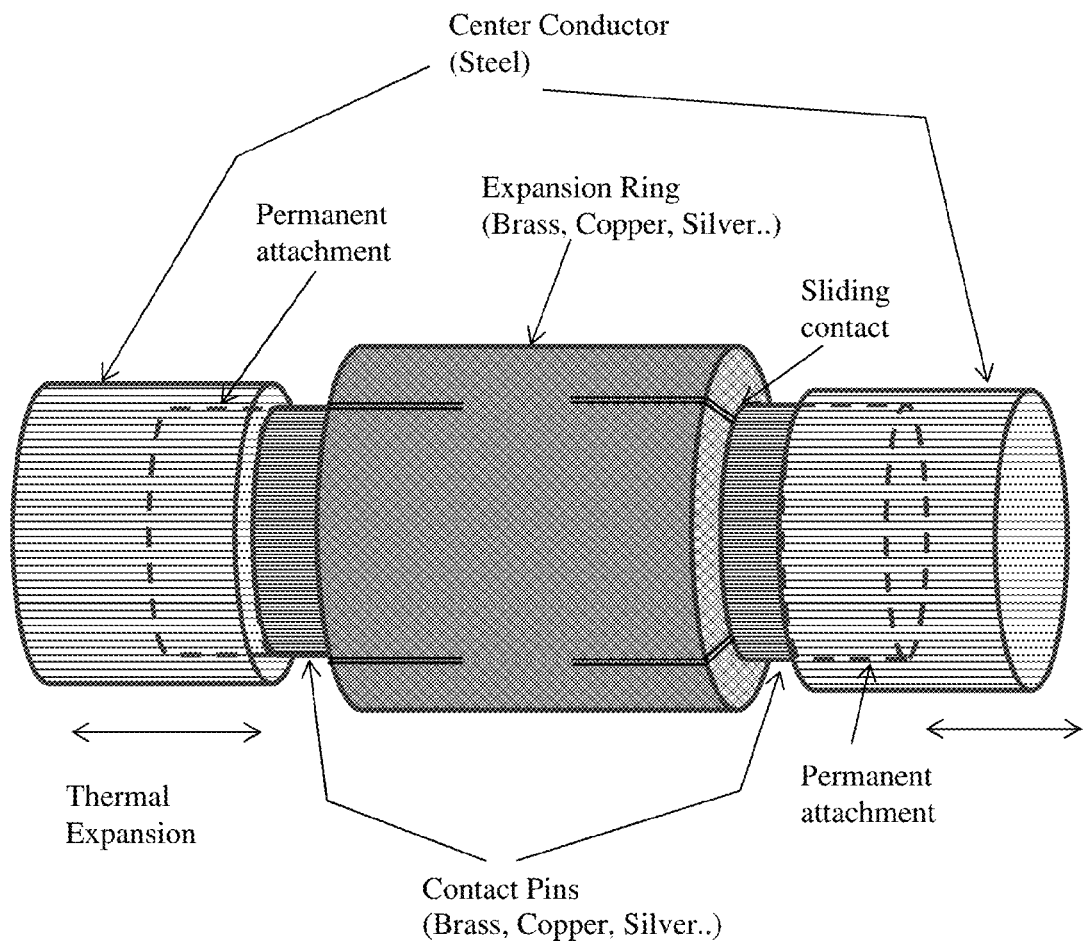
FIG. 15 depicts the 3D view of the contact tube sliding over the protrusions made as massive pin insertions into the center conductor segments.

An alternative, simplified embodiment, fulfilling the same requirements as hitherto disclosed in this invention is shown in FIG. 14. In this case the interface rods 112 and 118 are replaced by center pins 141 and 142, which are made of massive non-plated highly conductive metal, and are inserted and permanently attached to the center conductor segments 140 and 143, while sliding on the central tube 144 (and making good RF contact, as shown in FIG. 13) to allow for thermal expansion and contraction of the center conductor.

Figure 16:
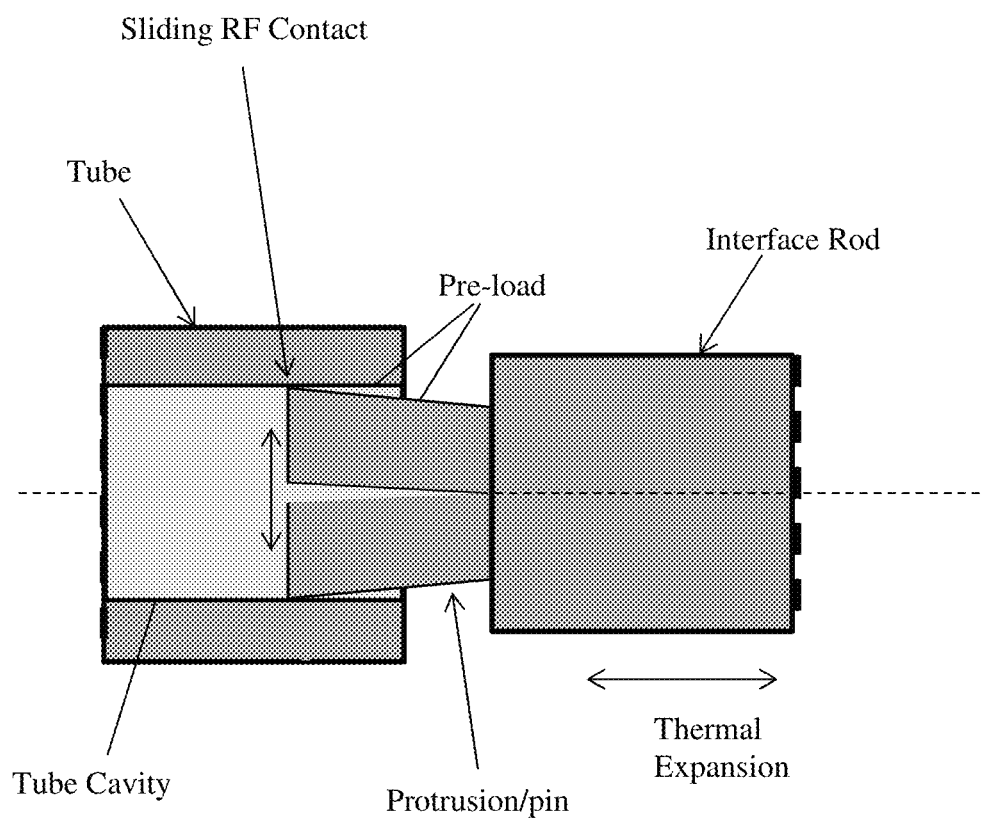
FIG. 16 depicts an embodiment whereby it is the inserting protrusion which is slotted and not the expansion tube.

FIG. 16 depicts an embodiment whereby it is the inserting protrusion which is slotted making contact from inside and not the expansion tube. This configuration has the reliability advantage that the spread of the protrusion is going to maintain its shape and therefore the sliding RF contact, even if slightly compressed, which is not the case with the embodiment of FIGS. 10, 11, 13 and 15.

The tuner is calibrated using a network analyzer 80, VNA and a control computer 82 in room temperature; the tuner is connected using RF cables 85 to the VNA ports and using digital cables 88 to the computer 82; the computer controls also the VNA using different digital cables and communication protocol 81; the probes 84 are positioned horizontally and vertically inside the slabline 89 in order to generate desired reflection factors within the tuning range of said tuner (FIG. 8); the collected s-parameter data from the VNA are saved in tuner calibration files. This generic tuner calibration method is used abundantly in the specific art and is hereby applied to the high reliability high power tuner as well with a higher probability of eliminating shorts and systemic measurement errors at high power operation.

Obvious alternative embodiments to the herein disclosed method of controlling the temperature and thermal expansion of the center conductor of slide screw impedance tuners are imaginable and possible but shall not impede on to the validity of the basic idea of the present invention.

What I claim as my invention is:

1. A high reliability RF impedance tuner comprising
   a test port and an idle port and an axially slotted airline (slabline) between the ports,
   said slabline comprising a center conductor and two coaxial connectors associated with the ports;
   whereby the center conductor is sectioned at least once, forming at least one pair of center conductor segments;
   whereby the adjacent segments of each pair are joined mechanically and electrically using
   a) a coaxial tube,
   b) two interface rods,
   whereby the interface rods and the tube are made of massive highly electrically conductive material,
   and whereby the rods are mounted on the center conductor segments, one on each side of the tube,
   and whereby the tube slide-fits on central cylindrical axial protrusions, carved out from the adjacent ends of the interface rods,
   and whereby the total length of center conductor segments plus interface rods plus tube(s) is less than the distance between the two coaxial connectors;
   whereby the center conductor has a diameter Do, the protrusions have a diameter D1 and the tube has a diameter D2;
   and one or more mobile carriages moving parallel to the axis of the slabline and carrying one or more metallic capacitive tuning probes each;
   wherein the probe(s) are insertable perpendicularly into the slot of the slabline.

2. The tuner of claim 1,
   whereby
   the diameter of the interface rods are approximately equal to the diameter of the center conductor
   and
   the external diameter of the tube(s) is larger than the diameter of the center conductor;
   and whereby the difference between
   (a) the distance between the two coaxial connectors and
   (b) the sum of the lengths of the center conductor segments and the interface rods and the tube(s),
   is at least equal to the maximum expected, thermally caused, total linear expansion of the center conductor segments and interface rods.

3. The tuner of claim 2 whereby the center conductor is gold plated.

4. The tuner of claim 2 whereby the center conductor is silver plated.

5. The tuner of claim 1, whereby the mobile carriages and probes are remotely controlled using electrical (stepper) motors and appropriate gear, control electronics and firmware.

6. The tuner of claim 5 wherein the characteristic impedance Zo of the slabline is 50 Ohms.

7. The tuner of claim 6, whereby
   the diameter D1 of the protrusions of the interface rods is smaller than the diameter Do of the center conductor segments, D1<Do;
   and
   the diameter D2 of the tube(s) is larger than the diameter Do of the center conductor segments, D2>Do;
   and whereby D1 is selected to increase the characteristic impedance Z of the slabline by approximately the same amount as D2 is decreasing it: $Z(D1)-Z(Do) \approx Z(Do)-Z(D2)$.

8. A tuner calibration method for tuners as in claim 6, whereby the tuner is connected to a pre-calibrated vector network analyzer (VNA), which is in operational communication with a control computer;
   whereby the computer also controls the position of the tuner carriages and probes and collects data from the VNA;
   and whereby the computer places the probes to a multitude of horizontal and vertical positions;
   and wherein the probe positions create reflection factors at the operation frequency covering a desired area of the Smith chart;
   and wherein the collected data (s-parameters) and the associated probe positions are saved in tuner calibration files for later use.

9. The tuner of claim 1,
   whereby the interface rods are massive, central, axial, highly electrically conductive metallic pins, inserted into and permanently attached to the center conductor segments on both sides of the tube, while making sliding RF contact with the inner walls of the tube.

10. The tuner as in claim 1 or 9,
    whereby the diameter (D2) of the tube is approximately equal to the diameter (Do) of the center conductor.

* * * * *